(12) United States Patent
Broughton et al.

(10) Patent No.: US 9,730,274 B2
(45) Date of Patent: Aug. 8, 2017

(54) ELECTRICAL CONNECTORS

(71) Applicant: ROLLS-ROYCE PLC, London (GB)

(72) Inventors: Paul Broughton, Leicester (GB); Richard Peace, Derby (GB); Gary Alan Skinner, Nottingham (GB); Michael Christopher Willmot, Sheffield (GB); Robin Charles Kennea, Nottingham (GB)

(73) Assignee: ROLLS-ROYCE plc, London (GB)

( * ) Notice: Subject to any disclaimer, the term of this patent is extended or adjusted under 35 U.S.C. 154(b) by 912 days.

(21) Appl. No.: 13/716,254

(22) Filed: Dec. 17, 2012

(65) Prior Publication Data

US 2013/0161094 A1 Jun. 27, 2013

(30) Foreign Application Priority Data

Dec. 22, 2011 (GB) .................................. 1122140.5
Dec. 22, 2011 (GB) .................................. 1122143.9

(Continued)

(51) Int. Cl.
*H05B 3/28* (2006.01)
*F02C 7/12* (2006.01)
(Continued)

(52) U.S. Cl.
CPC ................ *H05B 3/28* (2013.01); *B23P 6/005* (2013.01); *B60R 16/00* (2013.01); *B60R 16/02* (2013.01);
(Continued)

(58) Field of Classification Search
CPC ...... H01R 12/61; H01R 12/78; H01R 12/285; H01R 12/52; H01R 12/613; H01R 12/00;
(Continued)

(56) References Cited

U.S. PATENT DOCUMENTS 2,523,083 A 9/1950 Witkowski
2,523,504 A 9/1950 Ford, Jr.
(Continued)

FOREIGN PATENT DOCUMENTS

DE 2941950 B1 2/1981
EP 1741879 A1 1/2007
(Continued)

OTHER PUBLICATIONS

Nov. 10, 2014 Office Action issued in U.S. Appl. No. 13/716,300.
(Continued)

*Primary Examiner* — Ishwarbhai B Patel
*Assistant Examiner* — Paresh Paghadal
(74) *Attorney, Agent, or Firm* — Oliff PLC

(57) ABSTRACT

An electrical raft 200 comprising electrical conductors 252 embedded in a rigid material are provided to a gas turbine engine. The raft 200 is used to transport electrical signals (which may be, for example power and/or control signals) around a gas turbine engine. The electrical raft 200 has an electrical connector 700 embedded therein which is used to connect the electrical raft to an electrical unit, such as an EEC of a gas turbine engine The electrical connector 700 is resiliently biased so as to ensure a reliable electrical connection.

10 Claims, 6 Drawing Sheets

(30) Foreign Application Priority Data

Mar. 7, 2012 (GB) .................................. 1203991.3
May 3, 2012 (GB) .................................. 1207735.0

(51) Int. Cl.

| | | |
|---|---|---|
| F02C 7/20 | (2006.01) | |
| B23P 6/00 | (2006.01) | |
| H02G 3/04 | (2006.01) | |
| H01R 12/00 | (2006.01) | |
| H02G 3/32 | (2006.01) | |
| B60R 16/02 | (2006.01) | |
| B64C 3/34 | (2006.01) | |
| F02C 7/141 | (2006.01) | |
| B60R 16/08 | (2006.01) | |
| F02C 7/16 | (2006.01) | |
| H01R 12/57 | (2011.01) | |
| H01R 12/59 | (2011.01) | |
| H01R 12/51 | (2011.01) | |
| H01R 12/61 | (2011.01) | |
| H02G 3/00 | (2006.01) | |
| B60R 16/00 | (2006.01) | |
| B64D 29/08 | (2006.01) | |
| F02C 7/00 | (2006.01) | |
| F02C 7/32 | (2006.01) | |
| H02G 1/00 | (2006.01) | |
| H02G 3/02 | (2006.01) | |
| F02C 7/047 | (2006.01) | |
| F02C 7/224 | (2006.01) | |
| F24H 1/10 | (2006.01) | |
| H05B 1/02 | (2006.01) | |
| H05K 7/20 | (2006.01) | |

(52) U.S. Cl.
CPC ...... *B60R 16/0207* (2013.01); *B60R 16/0215* (2013.01); *B60R 16/08* (2013.01); *B64C 3/34* (2013.01); *B64D 29/08* (2013.01); *F02C 7/00* (2013.01); *F02C 7/047* (2013.01); *F02C 7/12* (2013.01); *F02C 7/141* (2013.01); *F02C 7/16* (2013.01); *F02C 7/20* (2013.01); *F02C 7/224* (2013.01); *F02C 7/32* (2013.01); *F24H 1/105* (2013.01); *H01R 12/00* (2013.01); *H01R 12/51* (2013.01); *H01R 12/515* (2013.01); *H01R 12/57* (2013.01); *H01R 12/59* (2013.01); *H01R 12/592* (2013.01); *H01R 12/61* (2013.01); *H02G 1/00* (2013.01); *H02G 3/00* (2013.01); *H02G 3/02* (2013.01); *H02G 3/04* (2013.01); *H02G 3/32* (2013.01); *H05B 1/0236* (2013.01); *H05K 7/20* (2013.01); *F05D 2260/30* (2013.01); *Y02T 50/672* (2013.01); *Y10T 29/49002* (2015.01); *Y10T 29/49117* (2015.01); *Y10T 29/49234* (2015.01); *Y10T 29/49236* (2015.01); *Y10T 29/49238* (2015.01); *Y10T 156/10* (2015.01)

(58) Field of Classification Search
CPC ...... H01R 12/51; H01R 12/515; H01R 12/57; H01R 12/59; H01R 12/592; H05K 2201/05; H05K 2201/10189; H05B 3/28; B23P 6/005; B60R 16/00; B60R 16/02; B60R 16/0207; B60R 16/0215; B60R 16/08; B64C 3/34; B64D 29/08; F02C 7/00; F02C 7/047; F02C 7/12; F02C 7/141; F02C 7/16; F02C 7/20; F02C 7/224; F02C 7/32; H02G 3/00; H02G 3/02; H02G 3/04; H02G 3/032; Y10T 156/10; Y10T 29/49002; Y10T 29/49117; Y10T 29/49234; Y10T 29/49236; Y10T 29/49238

USPC .................................. 439/77, 78, 79, 80, 81
See application file for complete search history.

(56) References Cited

U.S. PATENT DOCUMENTS

| | | | |
|---|---|---|---|
| 2,877,544 | A | 3/1959 | Gammel |
| 3,128,214 | A | 4/1964 | Lay |
| 3,201,721 | A * | 8/1965 | Voelcker ............... H01P 5/085 333/260 |
| 3,284,003 | A | 11/1966 | Ciemochowski |
| 3,494,657 | A | 2/1970 | Harper et al. |
| 3,612,744 | A | 10/1971 | Thomas |
| 3,700,825 | A | 10/1972 | Taplin et al. |
| 3,710,568 | A | 1/1973 | Rice |
| 4,137,888 | A | 2/1979 | Allan |
| 4,149,567 | A | 4/1979 | Weirich |
| 4,220,912 | A | 9/1980 | Williams |
| 4,488,970 | A | 12/1984 | Clark |
| 4,671,593 | A | 6/1987 | Millon-Fremillon et al. |
| 4,996,478 | A * | 2/1991 | Pope .................... G01R 1/04 324/755.02 |
| 5,004,639 | A | 4/1991 | Desai |
| 5,031,396 | A | 7/1991 | Margnelli |
| 5,091,605 | A | 2/1992 | Clifford |
| 5,138,784 | A | 8/1992 | Niwa |
| 5,142,448 | A | 8/1992 | Kober et al. |
| 5,174,110 | A * | 12/1992 | Duesler et al. ............. 60/226.1 |
| 5,249,417 | A | 10/1993 | Duesler et al. |
| 5,435,124 | A | 7/1995 | Sadil et al. |
| 5,688,145 | A | 11/1997 | Liu |
| 5,692,909 | A | 12/1997 | Gadzinski |
| 5,795,172 | A * | 8/1998 | Shahriari et al. ........... 439/260 |
| 5,870,824 | A | 2/1999 | Lilja et al. |
| 5,876,013 | A | 3/1999 | Ott |
| 5,885,111 | A | 3/1999 | Yu |
| 5,895,889 | A | 4/1999 | Uchida et al. |
| 5,938,465 | A * | 8/1999 | Fox, Sr. ............... H01R 13/627 439/350 |
| 6,050,853 | A | 4/2000 | Ando et al. |
| 6,149,469 | A * | 11/2000 | Kim ................... H01R 31/06 439/218 |
| 6,157,542 | A | 12/2000 | Wu |
| 6,399,889 | B1 * | 6/2002 | Korkowski et al. .......... 174/255 |
| 6,434,473 | B1 | 8/2002 | Hattori |
| 6,481,101 | B2 | 11/2002 | Reichinger |
| 6,588,820 | B2 | 7/2003 | Rice |
| 6,689,446 | B2 | 2/2004 | Barnes et al. |
| 6,702,607 | B2 | 3/2004 | Kondo |
| 6,945,803 | B2 * | 9/2005 | Potega ................... G01K 1/02 374/E1.002 |
| 6,969,807 | B1 | 11/2005 | Lin et al. |
| 6,971,650 | B2 | 12/2005 | Marelja |
| 6,971,841 | B2 | 12/2005 | Care |
| 7,002,269 | B2 * | 2/2006 | Angerpointer ............ 310/68 R |
| 7,010,906 | B2 | 3/2006 | Cazenave et al. |
| 7,232,315 | B2 * | 6/2007 | Uchida et al. ................ 439/67 |
| 7,281,318 | B2 | 10/2007 | Marshall et al. |
| 7,316,589 | B1 * | 1/2008 | Rogers ................ H01R 23/26 439/668 |
| 7,389,977 | B1 | 6/2008 | Fernandez et al. |
| 7,414,189 | B2 | 8/2008 | Griess |
| 7,500,644 | B2 | 3/2009 | Naudet et al. |
| 7,506,499 | B2 | 3/2009 | Fert et al. |
| 7,516,621 | B2 | 4/2009 | Suttie et al. |
| 7,525,816 | B2 * | 4/2009 | Sawachi .................. 361/792 |
| 7,543,442 | B2 | 6/2009 | Derenes et al. |
| 7,611,367 | B2 * | 11/2009 | Lee ...................... H01R 24/58 439/218 |
| 7,661,272 | B2 | 2/2010 | Gagneux et al. |
| 7,745,730 | B2 | 6/2010 | Bailey |
| 7,762,502 | B2 | 7/2010 | Mesing et al. |

(56) References Cited

U.S. PATENT DOCUMENTS

| | | | |
|---|---|---|---|
| 7,789,697 B2 * | 9/2010 | Fiennes | H01R 13/7031 439/188 |
| 7,837,497 B1 * | 11/2010 | Matsuo et al. | 439/492 |
| 7,862,348 B2 * | 1/2011 | Strauss | 439/83 |
| 8,038,104 B1 | 10/2011 | Larkin | |
| 8,137,524 B2 | 3/2012 | Berggren et al. | |
| 8,317,524 B2 | 11/2012 | Bailey | |
| 8,491,013 B2 * | 7/2013 | Peer et al. | 285/272 |
| 8,581,103 B2 * | 11/2013 | Aspas Puertolas | H05K 1/142 174/251 |
| 8,794,584 B2 | 8/2014 | Shimada et al. | |
| 8,937,254 B2 | 1/2015 | Wen et al. | |
| 9,010,716 B2 | 4/2015 | Kobori | |
| 9,040,821 B2 | 5/2015 | Blanchard et al. | |
| 2002/0086586 A1 | 7/2002 | Shi et al. | |
| 2002/0170729 A1 | 11/2002 | Murakami et al. | |
| 2003/0095389 A1 | 5/2003 | Samant et al. | |
| 2003/0155467 A1 | 8/2003 | Petrenko | |
| 2004/0065092 A1 | 4/2004 | Wadia et al. | |
| 2004/0266266 A1 | 12/2004 | Lai | |
| 2004/0266274 A1 | 12/2004 | Naudet et al. | |
| 2006/0183368 A1 * | 8/2006 | Kim | H01R 24/58 439/502 |
| 2006/0272340 A1 | 12/2006 | Petrenko | |
| 2006/0278423 A1 | 12/2006 | Ichikawa et al. | |
| 2007/0029454 A1 | 2/2007 | Suttie et al. | |
| 2007/0084216 A1 | 4/2007 | Mazeaud et al. | |
| 2007/0129902 A1 | 6/2007 | Orbell | |
| 2007/0186382 A1 * | 8/2007 | Huang | G06F 1/1681 16/293 |
| 2008/0128048 A1 | 6/2008 | Johnson et al. | |
| 2008/0179448 A1 | 7/2008 | Layland et al. | |
| 2008/0185478 A1 | 8/2008 | Dannenberg | |
| 2008/0245932 A1 | 10/2008 | Prellwitz et al. | |
| 2009/0189051 A1 | 7/2009 | Love | |
| 2009/0230650 A1 | 9/2009 | Mayen et al. | |
| 2009/0242703 A1 | 10/2009 | Alexander et al. | |
| 2009/0277578 A1 | 11/2009 | Sung et al. | |
| 2009/0289232 A1 * | 11/2009 | Rice | H01B 1/24 252/511 |
| 2010/0162726 A1 | 7/2010 | Robertson et al. | |
| 2010/0240259 A1 * | 9/2010 | Murphy | H01R 13/2421 439/668 |
| 2010/0261365 A1 | 10/2010 | Sakakura | |
| 2010/0308169 A1 | 12/2010 | Blanchard et al. | |
| 2011/0011627 A1 | 1/2011 | Aspas Puertolas | |
| 2011/0016882 A1 | 1/2011 | Woelke et al. | |
| 2011/0017879 A1 | 1/2011 | Woelke et al. | |
| 2011/0053468 A1 | 3/2011 | Vontell | |
| 2011/0111616 A1 * | 5/2011 | Chang et al. | 439/329 |
| 2011/0111643 A1 * | 5/2011 | Yin | H01R 13/2421 439/668 |
| 2011/0120748 A1 | 5/2011 | Bailey | |
| 2011/0315830 A1 | 12/2011 | Eshima et al. | |
| 2012/0012710 A1 | 1/2012 | Yamaguchi et al. | |
| 2012/0103685 A1 | 5/2012 | Blanchard et al. | |
| 2012/0111614 A1 | 5/2012 | Free | |
| 2012/0149232 A1 | 6/2012 | Balzano | |
| 2012/0312022 A1 | 12/2012 | Lam et al. | |
| 2013/0189868 A1 | 7/2013 | Fitt et al. | |
| 2013/0316147 A1 | 11/2013 | Douglas et al. | |

FOREIGN PATENT DOCUMENTS

| | | |
|---|---|---|
| EP | 1 760 291 A2 | 3/2007 |
| EP | 1 762 714 A2 | 3/2007 |
| EP | 2279852 | 2/2011 |
| EP | 2 590 270 A2 | 5/2013 |
| FR | 2871284 A1 | 12/2005 |
| GB | 1260339 A | 1/1972 |
| GB | 2152147 A | 7/1985 |
| GB | 2477337 A | 8/2011 |
| JP | A-63-285808 | 11/1988 |
| JP | A-4-167376 | 6/1992 |
| JP | A-4-223067 | 8/1992 |
| JP | A-5-129040 | 5/1993 |
| JP | A-2000-299151 | 10/2000 |
| WO | 2009/118561 A1 | 10/2009 |
| WO | WO 2010/075390 A2 | 7/2010 |
| WO | WO 2011/061074 A1 | 5/2011 |
| WO | WO 2011/117609 | 9/2011 |
| WO | WO 2011/127996 A1 | 10/2011 |

OTHER PUBLICATIONS

Nov. 20, 2014 Office Action issued in U.S. Appl. No. 13/716,648.
Fitt et al., Pending U.S. Appl. No. 13/792,851, filed Mar. 11, 2013.
Apr. 23, 2014 European Search Report issued in European Patent Application No. 12 19 7402.
Apr. 24, 2014 European Search Report issued in European Patent Application No. 13 19 5848.
Aug. 5, 2013 Search Report issued in British Patent Application No. 1308033.8.
Oct. 25, 2013 European Search Report issued in European Patent Application No. 13 15 8531.
Broughton et al., U.S. Appl. No. 14/100,745, filed Dec. 9, 2013.
Feb. 25, 2015 Office Action issued in U.S. Appl. No. 13/716,497.
Mar. 11, 2015 Office Action issued in U.S. Appl. No. 13/716,300.
Apr. 20, 2012 Search Report issued in British Patent Application No. GB1122140.5.
Apr. 19, 2012 Search Report issued in British Patent Application No. GB1122143.9.
Jun. 21, 2012 Search Report issued in British Patent Application No. GB1203991.3.
Jul. 31, 2012 Search Report issued in British Patent Application No. GB1207733.5.
Aug. 7, 2012 Search Report issued in British Patent Application No. GB1207735.0.
Oct. 23, 2012 Search Report issued in British Patent Application No. GB1212221.4.
Nov. 7, 2012 Search Report issued in British Patent Application No. GB1212223.0.
Broughton et al., Pending U.S. Appl. No. 13/716,648, filed Dec. 17, 2012.
Broughton et al., Pending U.S. Appl. No. 13/716,439, filed Dec. 17, 2012.
Broughton et al., Pending U.S. Appl. No. 13/716,497, filed Dec. 17, 2012.
Willmot et al., Pending U.S. Appl. No. 13/716,300, filed Dec. 17, 2012.
Willmot et al., Pending U.S. Appl. No. 13/716,239, filed Dec. 17, 2012.
Broughton et al., Pending U.S. Appl. No. 13/716,587, filed Dec. 17, 2012.
Maszczk et al., Pending U.S. Appl. No. 13/716,796, filed Dec. 17, 2012.
Willmot et al., Pending U.S. Appl. No. 13/716,808, filed Dec. 17, 2012.
Broughton et al., Pending U.S. Appl. No. 13/716,708, filed Dec. 17, 2012.
Dalton et al., Pending U.S. Appl. No. 13/716,244, filed Dec. 17, 2012.
Broughton et al., Pending U.S. Appl. No. 13/716,503, filed Dec. 17, 2012.
Broughton et al., Pending U.S. Appl. No. 13/716,516, filed Dec. 17, 2012.
Aug. 15, 2014 Office Action issued in U.S. Appl. No. 13/716,497.
Aug. 13, 2015 Office Action issued in U.S. Appl. No. 13/716,516.
Sep. 4, 2015 Office Action issued in U.S. Appl. No. 13/716,503.
Aug. 14, 2015 Office Action issued in U.S. Appl. No. 13/716,239.
Aug. 27, 2015 Office Action issued in U.S. Appl. No. 13/792,851.
Jul. 29, 2015 Office Action issued in U.S. Appl. No. 13/716,648.
Jul. 28, 2015 Office Action issued in U.S. Appl. No. 13/716,796.
Jul. 17, 2015 Office Action issued in U.S. Appl. No. 13/716,497.
Jun. 5, 2015 Office Action issued in U.S. Appl. No. 13/716,708.
Nellis and Klein, "Heat Transfer", 2009, Campridge University, pp. 748-751.

(56) References Cited

OTHER PUBLICATIONS

Jun. 19, 2015 Office Action issued in U.S. Appl. No. 13/716,244.
Apr. 6, 2015 Office Action issued in U.S. Appl. No. 13/716,648.

* cited by examiner

ELECTRICAL CONNECTORS

CROSS-REFERENCE TO RELATED APPLICATIONS

This application is based upon and claims the benefit of priority from British Patent Application Number 1122140.5 filed 22 Dec. 2011, British Patent Application Number 1122143.9 filed 22 Dec. 2011, British Patent Application Number 1203991.3 filed 7 Mar. 2012 and British Patent Application Number 1207735.0 filed 3 May 2012, the entire contents of which are incorporated by reference.

BACKGROUND OF THE INVENTION

1. Field of the Invention

This invention relates to connecting electrical units. In particular, aspects of the invention relate to connectors between rigid electrical rafts used to distribute electrical signals around a gas turbine engine, and electrical units mounted on the rigid electrical rafts.

2. Description of the Related Art

A typical gas turbine engine has a substantial number of electrical components which serve, for example, to sense operating parameters of the engine and/or to control actuators which operate devices in the engine. Such devices may, for example, control fuel flow, variable vanes and air bleed valves. The actuators may themselves be electrically powered, although some may be pneumatically or hydraulically powered, but controlled by electrical signals.

Electrical power, and signals to and from the individual electrical components, are commonly transmitted along conductors. Conventionally, such conductors may be in the form of wires and/or cables which are assembled together in a harness. In such a conventional harness, each wire may be surrounded by an insulating sleeve, which may be braided or have a braided cover.

By way of example, FIG. 1 of the accompanying drawings shows a typical gas turbine engine including two conventional wiring harnesses 102, 104, each provided with a respective connector component 106, 108 for connection to circuitry, which may be for example accommodated within the airframe of an aircraft in which the engine is installed.

The harnesses 102, 104 are assembled from individual wires and cables which are held together over at least part of their lengths by suitable sleeving and/or braiding. Individual wires and cables, for example those indicated at 110, emerge from the sleeving or braiding to terminate at plug or socket connector components 112 for cooperation with complementary socket or plug connector components 114 on, or connected to, the respective electrical components.

Thus the conventional electrical harness has to be provided with plug or socket connector components 112 for connection to other electrical components, such as electrical units such as engine control units. These conventional plug or socket connector components add weight and complexity to the electrical harnesses. Furthermore, the conventional plug or socket connectors are exposed to the engine environment. Thus, the conventional plug or socket connectors may be exposed to, for example, high temperatures and/or vibrations. The exposed connectors therefore need to be particularly robust in order to survive this environment. This means that the conventional exposed connectors are bulky and heavy. Even such bulky and heavy connectors may still be susceptible to damage and/or becoming loose, for example due to engine vibration.

Each conventional harness 102, 104 comprises a multitude of insulated wires and cables. This makes the conventional harness itself bulky, heavy and difficult to manipulate. The conventional harnesses occupy significant space within a gas turbine engine (for example within the nacelle of a gas turbine engine), and thus may compromise the design of the aircraft, for example the size and/or weight and/or shape of the nacelle.

Conventional harnesses comprise a large number of components, including various individual wires and/or bundles of wires, supporting components (such as brackets or cables) and electrical and/or mechanical connectors. This can make the assembly process complicated (and thus susceptible to errors) and/or time consuming. Disassembly of the conventional harnesses (for example removal of the conventional harnesses from a gas turbine engine during maintenance) may also be complicated and/or time consuming. Thus, in many maintenance (or repair or overhaul) procedures on a gas turbine engine, removal and subsequent refitting of the conventional electrical harness may account for a very significant portion of the operation time and/or account for a significant proportion of the potential assembly errors.

The electrical conductors in the conventional harnesses may be susceptible to mechanical damage. For example, mechanical damage may occur during installation (for example through accidental piercing of the protective sleeves/braiding) and/or during service (for example due to vibration). In order to reduce the likelihood of damage to the conductors in a conventional harness, the protective sleeves/braiding may need to be further reinforced, adding still further weight and reducing the ease with which they can be manipulated. Similarly, the exposed electrical connectors used to connect one conductor to another conductor or conductors to electrical units may be susceptible to damage and/or may add significant weight to the engine.

OBJECTS AND SUMMARY OF THE INVENTION

According to an aspect of the invention, there is provided an electrical raft comprising a rigid material having multiple electrical conductors embedded therein. The electrical raft may, for example, be for a gas turbine engine. The electrical conductors may be used to transfer electrical signals around a gas turbine engine. The electrical raft also comprises an electrical connector for electrically connecting electrical conductors in the electrical raft to an electrical unit. The electrical connector comprises an embedded portion that is embedded in the rigid material. The electrical connector also comprises a contact portion, at least partially protruding from a surface of the rigid material. The contact portion is for electrically contacting a unit electrical connector on said electrical unit. The electrical connector also comprises a resiliently biased portion configured to bias the contact portion away from the embedded portion when the contact portion is moved towards the embedded portion.

The resiliently biased portion may be, by way of example only, any type of spring. The resiliently biased portion may be provided between the embedded portion and the contact portion.

Any suitable material may be used for the rigid material. For example, the rigid material may be a rigid composite material, for example an organic matrix composite. Such a rigid composite material may be particularly stiff and/or lightweight. Thus, a rigid composite raft may be used that has suitable mechanical properties, whilst being thin and lightweight, for example compared with some other materials. The rigid composite material may comprise any suitable combination of resin and fibre as desired for a particular application. For example, any of the resins and/or fibres described herein may be used to produce a rigid composite material for the electrical raft. Any suitable fibres may be used, for example carbon fibres, glass fibres, aramid fibres, and/or para-aramid fibres. The fibres may be of any type, such as woven and/or chopped. Any suitable resin may be used, for example epoxy, BMI (bismaleimide), PEEK (polyetheretherketone), PTFE (polytetraflouroethylene), PAEK (polyaryletherketone), polyurethane, and/or polyamides (such as nylon).

The contact portion may be biased away from the surface of the rigid raft from which it protrudes by the resiliently biased portion. The electrical raft may be at least a part of an electrical harness for a gas turbine engine, and thus may be referred to herein as an electrical harness raft.

The electrical conductors embedded in the rigid material may be used to transfer electrical signals around a gas turbine engine. Embedding electrical conductors in a rigid material (to create an electrical raft) has a great number of advantages over transferring electrical signals using a conventional harness, at least some of which are discussed herein.

The electrical rafts may provide greater protection to the electrical conductors than a conventional harness. For example, the rigid and/or hard material (which may be a rigid and/or hard composite material) in which the conductors are embedded may provide greater protection (for example greater mechanical protection) to the embedded conductors, for example due to being resistant to breaking and/or snapping and/or piercing and/or puncturing. Purely by way of example, the use of electrical rafts may reduce, or substantially eliminate, the chance of foreign bodies coming into contact with the electrical conductors, for example through fluid ingress. The electrical raft(s) may provide improved protection to the electrical conductors during manufacture/assembly of the raft/gas turbine installation, and/or during service/operation/maintenance of the gas turbine engine. This may result in lower maintenance costs, for example due to fewer damaged components requiring replacement/repair and/or due to the possibility of extending time intervals (or service intervals) between inspecting the electrical system, for example compared with a system using only conventional harnesses.

Further advantages are provided by including an electrical connector (which may be referred to as a terminal) with a contact portion, a resiliently biased portion, and an embedded portion in the electrical raft. The electrical connector(s), which may be referred to as being integrated with, or integral to, the electrical raft, is/are protected by the rigid material of the raft and thus may be more reliable and less susceptible to damage. They may also be lighter and more compact, because no additional protection for the connectors may be required. Furthermore, because they may be assembled with the electrical raft, their position can be determined accurately, and not susceptible to error during connection to other units. The resilient bias provided by the resiliently biased portion may help to ensure that a robust electrical contact is maintained with connected electrical units throughout operation, for example in high vibration environments such as gas turbine engines.

The electrical raft may comprise at least two substantially opposing electrical connectors forming a set of electrical connectors. The electrical raft may comprise at least two sets of opposing electrical connectors. The direction of the biasing force from the respective resiliently biased portion of the electrical connectors may be substantially opposite for two substantially opposing electrical connectors. The respective contact portions of two substantially opposing electrical connectors may be facing each other.

Having a set of opposing electrical connectors in the electrical raft may help to ensure that a robust electrical contact is maintained between the electrical raft and a connected electrical unit, for example in a high vibration environment. For example, opposing electrical connectors may be biased in opposite directions towards where the electrical connector of an electrical unit would be positioned when connected. In this way, movement of a connected electrical unit could be tolerated without loss of electrical contact.

At least a part of the resiliently biased portion may be contained within the rigid material. For example, some or all of the resiliently biased portion may be embedded in the rigid material, for example in an unbiased state. Accordingly, the resiliently biased portion, and any associated moving parts, may be protected from the surrounding environment by the rigid material. This may help to reduce the possibility of damage to the resiliently biased portion and/or increase its operational/service life, without having to provide dedicated protection.

The electrical raft may comprise a mounting surface for mounting said electrical unit. The or each electrical connector of the electrical raft may be provided in a recess extending from the mounting surface into the rigid material. Providing the electrical connector(s) in a recess in the rigid material may provide further protection to the electrical connector(s). Additionally/alternatively, this may be a particularly convenient arrangement for allowing an electrical unit to be connected to the electrical raft, because the electrical unit could have an electrical connector arranged to protrude into the recess when the unit is mounted on the mounting surface of the electrical raft.

The contact portion of the or each electrical connector may extend from the recess in a direction that is substantially parallel to the mounting surface. The resilient bias may act in a plane that is substantially parallel to the mounting surface. The contact portions of the electrical connectors may thus be biased into the recess. As explained elsewhere, this may be convenient for biasing the contact portions towards an electrical connector of an electrical unit that may be connected to the electrical raft.

The electrical raft may comprise mounting portions for mechanically mounting an electrical unit to the electrical raft, the mounting portions being different separate from the or each electrical connector. The mounting portions may be provided at different, separate physical locations to the electrical connectors. In this way, the resiliently biased electrical connectors of the electrical raft may be substantially independent of the mechanical fixing, and thus the continuity of the electrical connection may be substantially independent of the accuracy of the mechanical fixing.

At least one of the electrical conductors embedded in the electrical raft may be an electrically conductive wire. The or each electrically conductive wire may be surrounded by an electrically insulating sleeve. As such, individual wires may be laid into (or embedded in) the electrical raft, and each wire may be used to transfer one or more electrical signals through the raft and around the engine. Providing a sleeve to the individual wires may provide extra mechanical and/or electrical protection/isolation.

At least some (for example a plurality) of the electrical conductors may be provided in a flexible printed circuit. Thus, at least some of the electrical conductors may be provided as electrically conductive tracks in a flexible substrate. The flexible printed circuit may be flexible before being embedded in the rigid material.

Providing the electrical conductors as tracks in a flexible printed circuit may allow the size of the resulting electrical raft to be reduced further and/or substantially minimized. For example, many different electrical conductors may be laid into a flexible printed circuit in close proximity, thereby providing a compact structure. The flexible substrate of a single flexible printed circuit may provide electrical and/or mechanical protection/isolation to a large number of electrical conductors.

Any given electrical raft may be provided with one or more electrical wires embedded therein (which may be sheathed) and/or one or more flexible printed circuits embedded therein. As such, a given electrical raft may have wires and flexible printed circuits laid therein.

It will be appreciated that the embedded electrical conductors (whether they are provided as embedded electrical wires or as conductive tracks in a flexible printed circuit embedded in the rigid material) may be described as being fixed in position by the rigid material, for example relative to the rest of the electrical raft. It will also be appreciated that the embedded electrical conductors may be said to be surrounded by the rigid material and/or buried in the rigid material and/or integral with (or integrated into) the rigid material.

According to an aspect of the invention, there is provided an electrical raft assembly. The electrical raft assembly comprises an electrical raft including an electrical connector as described above and elsewhere herein. The electrical raft assembly also comprises an electrical unit mounted on the electrical raft. The electrical unit comprises a unit electrical connector that is in electrical contact with one or more of the or each electrical connector of the electrical raft.

The electrical unit may be any sort of electrical unit that may be provided to a gas turbine engine. For example, the electrical unit may be any type of electronic control unit (ECU), such as an Electronic Engine Controller (EEC) and an Engine Health Monitoring Unit (EMU). In some cases, the electrical unit may be a further electrical raft. Thus electrical conductors in the ECUs may be connected to electrical conductors of the electrical raft via the electrical connectors in the electrical raft. At least one electrical unit may be attached to an electrical raft in an electrical raft assembly.

Such an electrical raft assembly may be a particularly convenient, lightweight and/or compact way of providing (for example attaching, fixing or mounting) an electrical unit to the gas turbine engine. For example, the electrical unit and the electrical raft (which may form at least a part of an electrical harness for the gas turbine engine) may be assembled together (mechanically and/or electrically) before being installed on the gas turbine engine, as described elsewhere herein. The biased electrical contact of the electrical raft may ensure that the electrical unit is robustly electrically attached to the electrical raft (and thus potentially to an extended electrical system of the gas turbine engine). When the electrical unit is attached to the electrical raft, the respective connectors may not be exposed to the region outside the electrical raft assembly. In other words, the respective connected electrical connectors may be contained within the electrical raft assembly. This may help to protect the connectors from damage and/or degradation.

The electrical unit in the electrical raft assembly may comprise a mounting surface for mounting the electrical unit onto the electrical raft, for example onto a mounting surface of the electrical raft. The unit electrical connector may extend from the electrical unit into the electrical raft. For example, the unit electrical connector may extend into a recess in the electrical raft, such as the recess described above, which may be formed in a mounting surface of the electrical raft. This may be a particularly convenient arrangement for ensuring that the electrical connectors are contained within the electrical raft assembly, and thus protected.

The electrical raft and the electrical unit may be mechanically fixed together, for example using mechanical fixings that are independent of the electrical connectors. In this way, the engagement loading (for example provided by the biasing element) of the electrical contacts of the electrical raft and the electrical unit can be optimized for the electrical connection, and need not rely on or have to provide mechanical fixing.

The tip of the (or each) unit electrical connector and the tips of the or each electrical connectors of the electrical raft may point in substantially perpendicular directions, for example when connected together in an electrical raft assembly. This may assist in maintaining a clean and robust electrical connection between the connectors.

The contact portion of the or each electrical connector of the electrical raft may have a tapered cross-section (over at least a portion, for example over a tip portion of the contact portion), which may be shaped such that the contact portion is pushed against the resiliently biased portion by the unit electrical connector as the unit electrical connector is moved into position during assembly. According to this arrangement, the contact portion of the electrical connector of the electrical raft is contacted and pushed by the unit electrical connector, and thus the respective connectors may be wiped as they pass over each other. Again, this may help to ensure that the electrical connection is clean and robust.

According to an aspect of the invention, there is provided a gas turbine engine or gas turbine engine installation (for example for an airframe) comprising an electrical raft and/or an electrical raft assembly as described above and elsewhere herein. For example, at least one electrical raft and/or electrical raft assembly may be used as part of an electrical harness for transferring electrical signals around the engine, in the form of electrical harness raft(s) and/or electrical harness raft assemblies.

In such a gas turbine engine according to an aspect of the present invention, the electrical raft assembly may be a first engine installation component, and the gas turbine engine may further comprise a second engine installation component having electrical conductors, the first and second engine installation components may be a part of an electrical system. The gas turbine engine (or the electrical system) may further comprise at least one flexible cable connected between the electrical raft assembly and the second engine installation component so as to electrically connect electrical conductors of the electrical raft assembly with electrical conductors of the second engine installation component.

The second engine installation component may be, for example, an ECU, such as an EMU or EEC. Additionally or alternatively, the second engine installation component may be a further electrical raft or electrical raft assembly. The second engine installation component may or may not comprise an electrical connector, such as that provided to the first electrical component. Thus, the first and second engine installation components may form at least a part of an electrical harness raft. Such an electrical harness raft may comprise further electrical rafts and/or electrical harness raft assemblies and/or further flexible cable(s).

Use of one or more electrical rafts may significantly reduce build time of an engine. For example, use of electrical rafts may significantly reduce the part count involved in engine assembly compared with a conventional harness arrangement. The number and/or complexity of the operations required to assemble an engine (for example to assemble/install the electrical system (or network) and/or other peripheral components, which may be referred to in general as engine dressing) may be reduced. For example, rather than having to install/assemble a great number of wires and/or wiring looms together on the engine installation, it may only be necessary to attach a relatively small number of electrical rafts/electrical raft assemblies, which themselves may be straightforward to handle, position, secure and connect. Connection between the rafts and other electrical components using the flexible cable(s) may be particularly convenient and straightforward. Thus, use of electrical rafts in a gas turbine installation may reduce assembly time and/or reduce the possibility of errors occurring during assembly.

Use of electrical rafts may provide significant advantages during maintenance, such as repair and overhaul. As discussed above, the electrical rafts may be particularly quick and straightforward to assemble. The same advantages discussed above in relation to assembly apply to disassembly/removal from the gas turbine engine. Thus, any repair/overhaul that requires removal of at least a part of the electrical harness may be simplified and/or speeded up through use of electrical rafts as at least a part of the electrical harness, for example compared with conventional harnesses. Use of electrical rafts (for example as part of one or more electrical raft assemblies) may allow maintenance procedures to be advantageously adapted. For example, some maintenance procedures may only require access to a certain portion of the gas turbine engine that only requires a part of the harness to be removed. It may be difficult and/or time consuming, or not even possible, to only remove the required part of a conventional harness from a gas turbine engine. However, it may be relatively straightforward to only remove the relevant electrical raft, for example by simply disconnecting it from the engine and any other electrical rafts/components to which it is connected. Decreasing maintenance times has the advantage of, for example, reducing out-of service times (for example off-wing times for engines that are used on aircraft).

The build/assembly times may be additionally or alternatively reduced by pre-assembling and/or pre-testing individual and/or combinations of electrical rafts prior to engine assembly. This may allow the electrical and/or mechanical operation of the electrical rafts to be proven before installation, thereby reducing/eliminating the testing required during engine installation.

Accordingly, there is provided (and aspects of the invention may be used with/as a part of) a method of servicing a gas turbine engine, the method comprising: removing a first rigid raft assembly from the gas turbine engine, the rigid raft assembly incorporating at least a part of at least one component or system of the gas turbine engine; and installing a second, pre-prepared, rigid raft assembly onto the gas turbine engine in place of the first raft assembly. The first and second rigid raft assemblies may comprise electrical rafts having electrical conductors embedded in a rigid material. The electrical conductors may be at least a part of an electrical system arranged to transfer electrical signals around the engine.

The electrical rafts may be a particularly lightweight solution for transferring electrical signals around an engine. For example, an electrical raft may be lighter, for example significantly lighter, than a conventional harness required to transmit a given number of electrical signals. A plurality of conductors may be embedded in a single electrical raft, whereas in a conventional arrangement a large number of heavy, bulky wires and/or insulating sleeves would be required. The reduced weight may be particularly advantageous, for example, when used on gas turbine engines on aircraft.

Electrical rafts may be more easily packaged and/or more compact, for example than conventional harnesses. Indeed, the electrical rafts can be made into a very wide range of shapes as desired. This may be achieved, for example, by manufacturing the electrical rafts using a mould conforming to the desired shape. As such, each electrical raft may be shaped, for example, to turn through a tighter corner (or smaller bend radius) than a conventional harness. The electrical rafts may thus provide a particularly compact solution for transferring electrical signals around a gas turbine engine. The electrical rafts may be readily shaped to conform to neighbouring components/regions of a gas turbine engine, for example components/regions to which the particular electrical raft is attached, such as a fan casing or a core casing.

The environment of a gas turbine engine during operation may be particularly severe, with, for example, high levels of vibration and/or differential expansion between components as the temperature changes through operation and as the components move relative to each other. Providing at least one flexible cable to connect an electrical raft to another component may allow the electrical rafts and/or components to accommodate vibration and/or relative movement, for example of the component(s)/assemblies to which they are attached/mounted during use. For example, the flexible cable(s) used to electrically connect electrical raft(s) to other component(s) may have sufficient length to accommodate such vibration and/or movement during use.

For example, providing separate (for example more than one) electrical rafts and connecting at least some (for example at least two) of them together using at least one flexible cable may allow the electrical rafts to accommodate vibration and/or relative movement of the component(s)/assemblies to which they are attached/mounted during use.

It will be appreciated that the electrical signals transferred by the conductors in the electrical raft, and around the engine using the electrical rafts/raft assemblies may take any form. For example, the electrical signals may include, by way of non-limitative example, electrical power and/or electrical control/communication signals and/or any other type of transmission through an electrical conductor. Transmission of signals around the engine may mean transmission of signals between (to and/or from) any number of components/systems in the engine and/or components/system of a structure (such as an airframe) to which the gas turbine engine is (or is configured to be) connected/installed in. In other words, an electrical raft may be used to transfer/communicate any possible combination of electrical signals in any part of a gas turbine engine installation or a related (for example electrically and/or mechanically connected) structure/component/system.

An electrical raft or raft assembly may be provided in any suitable location/position of the gas turbine engine. For example, the gas turbine engine may comprise a bypass flow duct formed between an engine core and an engine fan casing (the gas turbine engine may be a turbofan engine, for example) and the electrical raft may form at least a part of a radially extending splitter (which may be referred to as a bifurcation) that extends across the bypass flow duct. In this way, an electrical raft (which may be referred to as a splitter electrical raft) may provide an electrical connection between a fan casing and an engine core.

An electrical raft may be provided with (for example have embedded therein) at least one additional electrical socket. The or each additional electrical socket may be in electrical contact with at least one of the respective electrical conductors embedded in the rigid material and may have terminals for connection with a complimentary connector. Such an additional electrical socket may take any suitable form, and may allow the electrical raft to be easily connected to other components, such as flexible cables and/or other electrical rafts.

An electrical raft may, have components and/or parts of other systems embedded therein, such as fluid passages (or pipes) that may form a part of a fluid system, for example for carrying a gas (such as cooling air, sealing air, and/or muscle air (for example for pneumatic systems)) and/or a liquid (such as fuel, water, oil and/or hydraulic fluid). Accordingly, there is provided (and aspects of the invention may be used with/as a part of) a rigid raft assembly for a gas turbine engine, the rigid raft assembly comprising a rigid material that carries at least a part of a first gas turbine engine system and at least a part of a second gas turbine engine system, wherein: the first gas turbine engine system is a fluid system that comprises at least one fluid passage that is at least partially embedded in the rigid raft assembly. The second gas turbine engine system may be an electrical system that comprises electrical conductors at least partially embedded in the rigid material. Thus the rigid raft assembly may be an electrical rigid raft assembly.

An electrical raft may be mechanically and/or electrically connected to other components/systems of the gas turbine engine, for example ancillary, auxiliary or control components. Such other components/systems may be provided to an electrical raft in any suitable manner. For example, such other components/systems may be mounted on one or more electrical rafts. Thus, a surface of an electrical harness raft may be used as a mounting surface for other gas turbine engine components/systems, such as ancillary/auxiliary components/systems.

An electrical raft may be provided with at least one mount on which other components (for example auxiliary/ancillary components/systems) of the gas turbine engine are (or may be) mounted. The mount may be a bracket, for example a bespoke bracket for the component/system mounted thereon or a conventional/standard bracket. The electrical raft may provide a stable, regular and convenient platform on which to mount the various systems/components. The combination of the installed electrical raft with components/systems mounted thereon may be much more compact and/or straightforward to assemble and/or have a greatly reduced number of component parts, for example compared with the corresponding conventional electrical harness and separately mounted components/systems.

The mounts may be used to attach any component/system to an electrical raft (and thus to the engine) as required. For example, fluid pipes for transferring fluid around the engine may be mounted to the electrical rafts (for example mechanically mounted using a bracket), and thus to the engine. The fluid pipes may be arranged to carry any fluid as desired, including gas (such as cooling air, sealing air, and/or muscle air (for example for pneumatic systems)) and/or liquid (such as fuel, water, oil and/or hydraulic fluid). Of course, more than one set of fluid pipes, for example for carrying different or the same fluids, may be mounted on the same electrical raft.

Examples of other components/systems that may be at least in part mounted to an electrical raft include, by way of non-limitative example: fire detectors and/or fire detection elements; thermocouples for measuring air temperature (for example within a particular engine zone); vibration monitoring processing equipment (for example a signal processing component/box containing electronics used to process a vibration signal that may be measured elsewhere in the engine); equipment for measuring fluid quality (for example a probe for oil debris monitoring may be provided to one or more pipes mounted to the raft, and/or a signal processing box for processing the oil quality measurements may be mounted on the box); and pressure sensors and/or signal processing equipment, for example for fluid pipes mounted on the rafts. At least some of these components/systems may form be electrically connected to the electrical conductors in the electrical raft using the electrical connector(s) of the electrical rafts.

At least one electrical raft or raft assembly may be connected/attached/mounted to the gas turbine engine using at least one anti-vibration mount. Using an anti-vibration mount to attach the electrical raft/assembly to the gas turbine engine may reduce (or substantially eliminate) the amount (for example the amplitude and/or the number/range of frequencies) of vibration being passed to the electrical raft from the gas turbine engine, for example during use. This may help to prolong the life of the electrical raft. Furthermore, any other components that may be attached to the electrical raft (as discussed above and elsewhere herein) may also benefit from being mounted to the gas turbine engine via the anti-vibration mounts, through being mounted on the electrical raft. For an electrical raft assembly, the reduced vibration may help to preserve the electrical contact between the electrical raft and the electrical unit connected thereto. As such, any components (such as the electrical unit mounted to the electrical raft in an electrical raft assembly) that would conventionally be mounted directly to the gas turbine engine and require at least a degree of vibration isolation no longer require their own dedicated anti-vibration mount. Thus, the total number of anti-vibration mounts that are required to assemble an engine may be reduced. This may reduce the number of parts required and the time taken to assemble an engine or engine installation and/or reduce the total assembled weight and/or reduce the likelihood of errors occurring during assembly.

Furthermore, components that are conventionally mounted to an engine without anti-vibration mounts (for example because of the weight and/or cost penalty), but which are now mounted to an electrical raft (for example to a mounting surface of the electrical raft), may benefit from vibration isolation without any weight/cost/assembly time penalty. This may reduce the possibility of damage occurring to such components and/or increase their service life. Such components may include, for example, ignitor boxes (used to provide high voltage power to engine ignitors), and pressure sensors/switches, for example for fluid systems such as oil, air, fuel, pneumatics and/or hydraulics.

According to an aspect of the invention, there is provided a method of assembling an electrical raft assembly as described above and elsewhere herein. The method comprises moving the electrical raft and the electrical unit together so that the unit electrical connector urges the contact portion of the or each electrical connector of the electrical raft against its respective resiliently biased portion.

Accordingly, the resiliently biased portion provides a biasing force on the contact portion towards the unit electrical connector. The method may also comprise mechanically fixing the electrical raft and electrical unit together using fixings that are separate from the electrical connectors. The contact portion may be shaped (for example tapered) so as to move against its bias when a force is provided by the unit electrical connector moving into its connected position. The biasing force provided to the contact portion by the biasing portion may act in a direction that is substantially perpendicular to direction of relative movement of the respective connections of the electrical raft and the electrical unit during assembly.

According to this method, the electrical connectors of one or both of the electrical raft and the electrical unit may be cleaned, through a wiping action, during assembly.

BRIEF DESCRIPTION OF THE DRAWINGS

The invention will now be described, by way of example only, with reference to the accompanying Figures, in which.

DETAILED DESCRIPTION OF THE PREFERRED EMBODIMENTS

Figure 1:
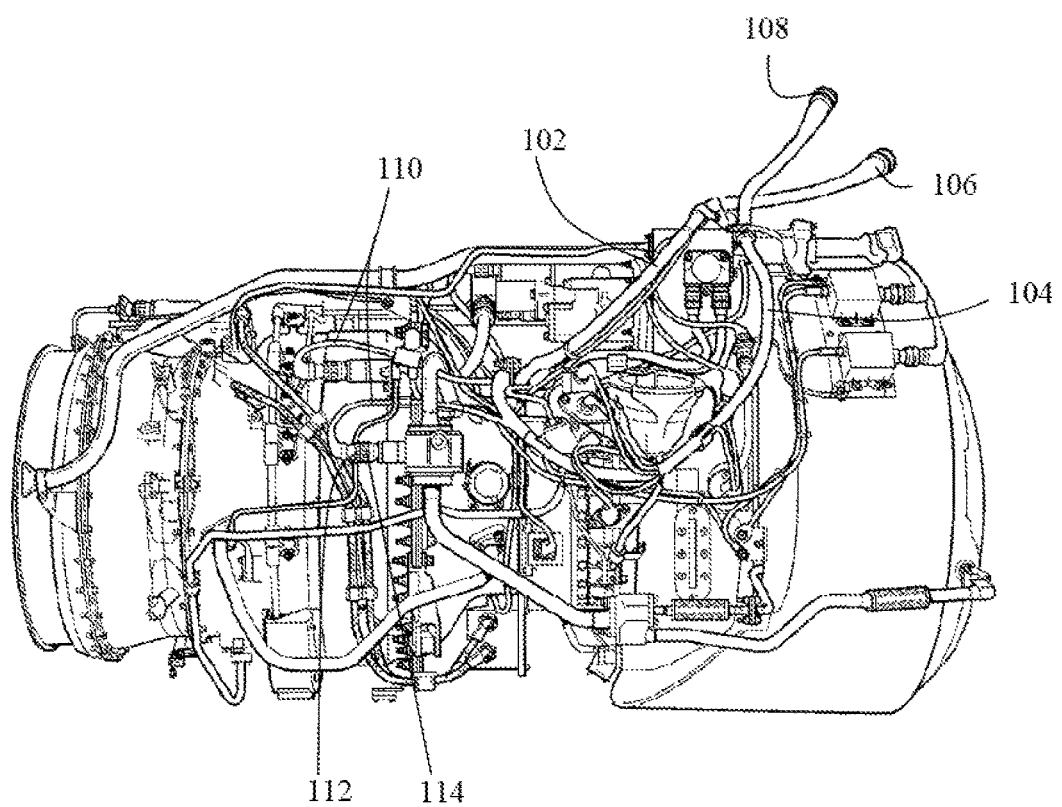
FIG. 1 shows a gas turbine engine with a conventional harness.
Figure 2:
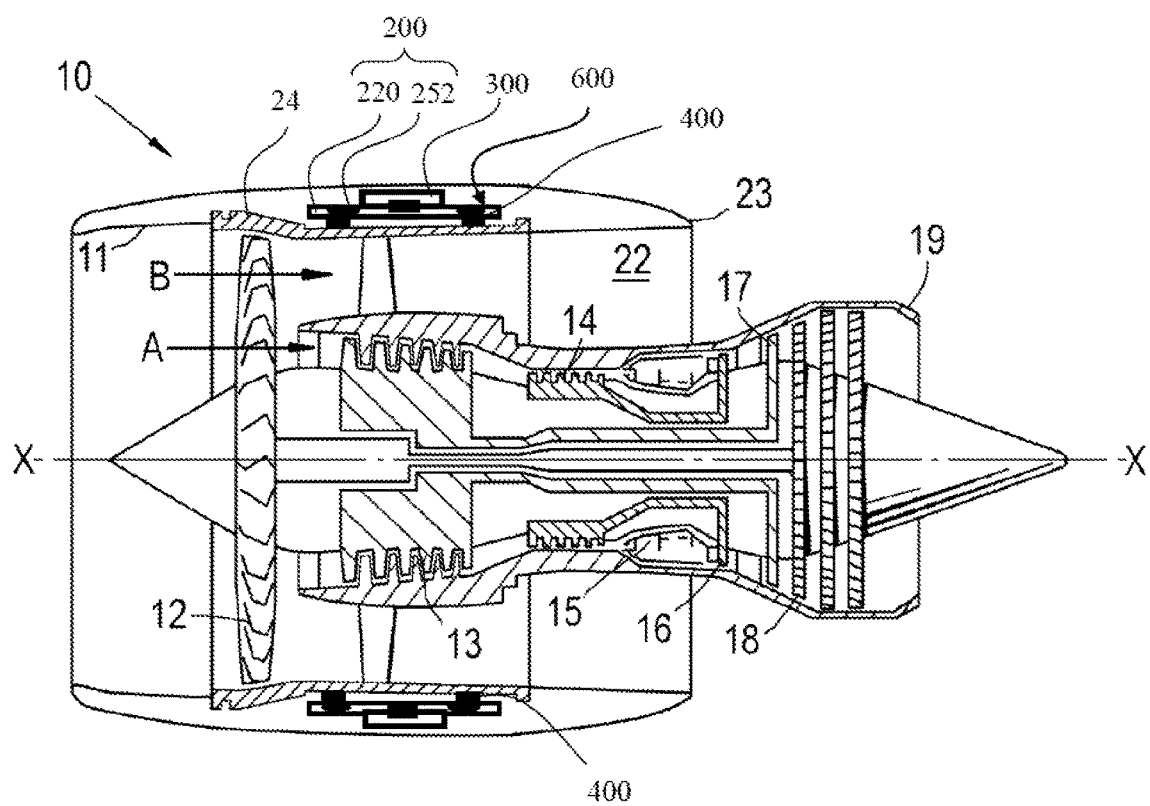
FIG. 2 shows a cross-section through a gas turbine engine having an electrical raft in accordance with the present invention.

With reference to FIG. 2, a ducted fan gas turbine engine generally indicated at 10 has a principal and rotational axis X-X. The engine 10 comprises, in axial flow series, an air intake 11, a propulsive fan 12, an intermediate pressure compressor 13, a high-pressure compressor 14, combustion equipment 15, a high-pressure turbine 16, and intermediate pressure turbine 17, a low-pressure turbine 18 and a core engine exhaust nozzle 19. The engine also has a bypass duct 22 and a bypass exhaust nozzle 23.

The gas turbine engine 10 works in a conventional manner so that air entering the intake 11 is accelerated by the fan 12 to produce two air flows: a first air flow A into the intermediate pressure compressor 13 and a second air flow B which passes through the bypass duct 22 to provide propulsive thrust. The intermediate pressure compressor 13 compresses the air flow A directed into it before delivering that air to the high pressure compressor 14 where further compression takes place.

The compressed air exhausted from the high-pressure compressor 14 is directed into the combustion equipment 15 where it is mixed with fuel and the mixture combusted. The resultant hot combustion products then expand through, and thereby drive the high, intermediate and low-pressure turbines 16, 17, 18 before being exhausted through the nozzle 19 to provide additional propulsive thrust. The high, intermediate and low-pressure turbines 16, 17, 18 respectively drive the high and intermediate pressure compressors 14, 13 and the fan 12 by suitable interconnecting shafts.

The gas turbine engine 10 shown in FIG. 2 comprises at least one electrical raft assembly 600 according to the present invention. As such, the gas turbine engine 10 is in accordance with the present invention. The electrical raft assembly 600 comprises an electrical raft 200. The electrical raft 200 may be used to transmit/transfer electrical signals (or electricity, including electrical power and/or electrical control signals) around the engine and/or to/from the engine 10 from other components, such as components of an airframe. The function and/or construction of the electrical raft 200 and electrical raft assembly 600 may be as described above and elsewhere herein.

In FIG. 2, the electrical raft 200 (which may be referred to herein simply as a raft 200 or an electrical harness raft 200) comprises at least one electrical conductor 252 embedded in a rigid material 220, which may be a rigid composite material. In the FIG. 2 arrangement, the electrical raft 200 is provided with an electrical unit 300. The electrical raft 200 and the electrical unit 300 together form the electrical raft assembly 600. In some embodiments, the electrical raft 200 (or the electrical raft assembly 600) may be provided with other gas turbine engine components/systems, such as fluid pipes or conduits forming at least a part of a fluid system. Such fluid pipes may be attached to the electrical raft 200 using mounting brackets. Additionally or alternatively, such fluid pipes may be embedded in the electrical raft 200.

The electrical raft 200 (and/or electrical raft assembly 600) may be attached to the rest of the gas turbine engine 10 using mounts 400, which may be anti-vibration (AV) mounts configured to reduce or substantially eliminate vibration from components of the gas turbine engine 10 being passed to the electrical raft 200, and thus to any components/systems 300 mounted thereon/connected thereto.

Figure 3:
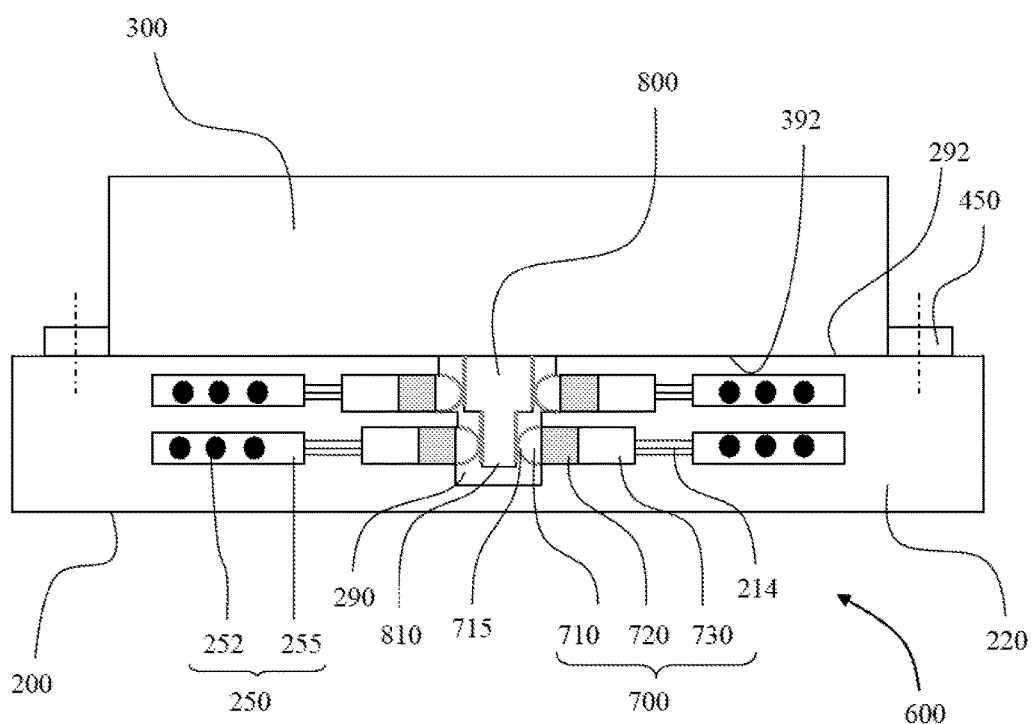
FIG. 3 shows an electrical raft having an electrical connector according to the present invention.

FIG. 3 is a more detailed view of the electrical raft assembly 600. The electrical raft 200, which forms part of the electrical raft assembly 600, comprises electrical connectors 700. The electrical connectors 700 allow the electrical raft 200 to be electrically connected to the electrical unit 300. In particular, one or more electrical connectors 700 are in electrical contact with one or more unit electrical connectors 800 of the electrical unit 300. Thus, circuits in the electrical unit 300 can be in communication with other components through an electrical raft 200, thereby allowing signals (for example control/communication signals) to be transferred between the electrical unit 300 other component/systems of the gas turbine engine 10 (and optionally to other components/parts to which the gas turbine engine 10 is attached).

The FIG. 3 embodiment has four electrical connectors 700, but different electrical rafts 200 in accordance with the invention may have different numbers of electrical connectors, for example 1, 2, 3, 5, 6, 7, 8, 9, 10 or more than 10 electrical connectors, some or all of which may be associated with (for example in electrical connection with) a single unit electrical connector 810. The FIG. 3 embodiment has only one unit electrical connector 810, but other electrical raft assemblies 600 in accordance with the invention may have electrical units 300 that have more than one unit electrical connector 810, for example 2, 3, 4, 5 or more than 5 unit electrical connectors 810.

Each (or at least one) connector 700 comprises an embedded portion 730, a contact portion 710, and a resiliently biased portion 720. The embedded portion 730 is at least partially embedded in the electrical raft 200. This may mean that the embedded portion 730 is immobile, or fixed, relative to the electrical raft 200. The embedded portion may be in electrical contact with the electrical conductors 252 embedded in the electrical raft 200 in any suitable manner. The embedded portion 730 may at least partially comprise a conductor, for example a metallic conductor, and may take any suitable form. The embedded portion 730 may simply be a fixed portion that is integral with the resiliently biased portion 720.

The contact portion 710 at least partially protrudes from the rigid material 220 of the electrical raft 200. The contact portion 710 may be made from any suitable material, and may comprise any suitable conductive material, for example a metallic conductive material. The contact portion 710 is arranged to form an electrical connection with a unit electrical connector 800 of the electrical unit 300. In the embodiment shown in FIG. 3, the contact portion 710 has a tapered, or dome-like, cross-section. Other embodiments may have different shapes of contact portion depending, for example, on the unit electrical connector 800 with which they contact in use.

The resiliently biased portion 720 provides a biasing force to the contact portion. In the FIG. 3 embodiment, the resiliently biased portion provides a biasing force towards a neutral position, i.e. if the contact portion 710 is moved away from its neutral position, the resiliently biased portion 720 provides a force to return the contact portion 710 to its neutral position. The neutral position may be a position in which the contact portion extends from the surface of the rigid material 220. Thus, if the contact portion is forced/moved into (or towards) the rigid material 220, for example by the unit electrical connector 800, then the resiliently biased portion 720 urges (or provides a force to) the contact portion back out of the rigid material, for example towards the unit electrical connector 800. The resiliently biased portion 720 may take any suitable form, for example any type of spring (such as a coil spring), and/or any suitable flexible member and/or any suitable compressible/elastic member. The resiliently biased portion 720 may be at least partially embedded in the rigid material 220.

An electrical connection is maintained between the embedded portion 730 and the contact portion 710. Thus, the resiliently biased portion 720 may comprise and/or accommodate an electrically conductive material. For example, the resiliently biased portion 720 may comprise and/or be at least partially manufactured by a metallic conductor.

In the FIG. 3 embodiment, at least the contact portion 710 of each electrical conductor 700 extends into a recess 290 in the electrical raft 200. The recess 290 may be said to be formed in the rigid material 220 of the electrical raft 200. The recess 290 may be formed in a mounting surface 292 of the electrical raft 200. The mounting surface 292 may be the surface on which the electrical unit 300 is mounted. As such the mounting surface 292 may be in contact with a mounting surface 392 of the electrical unit 300 when the electrical unit 300 and the electrical raft 200 are connected together to form the electrical raft assembly 600.

In the FIG. 3 example, when the electrical unit 300 and the electrical raft 200 are assembled together, the unit electrical connector 800 is pushed into the recess 290. The unit electrical connector 800 may extend in a direction that is perpendicular to the direction in which the electrical connector(s) 700 of the electrical raft 200 extend and/or to the direction of the biasing force provided by the biasing element 720. The direction of the biasing force may be substantially parallel to the mounting surface 292, as in the FIG. 3 example.

In the FIG. 3 arrangement, when the electrical unit 300 and the electrical raft 200 are moved together during assembly, the unit electrical connector 800 (for example the tip 810 of the unit electrical connector 800) pushes the contact portion 710 towards, or into, the rigid material 220, against the resilient bias of the resiliently biased portion 720. The direction of the biasing force may be substantially perpendicular to the relative direction of movement of the electrical unit 300 and the electrical raft 200 during assembly. As the unit electrical connector 800 moves past the contact portion 710 (which may taper to a tip 715), both the contact portion 710 and the unit electrical connector 800 may be wiped (i.e. they may wipe past each other), and thus may be cleaned. This may help to improve the electrical connection.

In the assembled state, the contact portion 710 of the electrical connector(s) 700 of the electrical raft 200 may be biased towards the unit electrical connector 800. This may help to ensure a robust electrical connection. For example, it may help to ensure that the electrical connection remains robust in the event of vibration. The electrical connection 700/800 may be substantially independent of the mechanical fixing 450 that holds the electrical raft 200 and the electrical unit 300 together. This may be advantageous, because it means that the engagement loading of the electrical contacts 700/800 may be substantially independent of the mechanical fixing. As such, the electrical connection may be substantially independent of the accuracy of the mechanical fixing 450. This may be at least in part due to the arrangement of the electrical connector 700 in the electrical raft 200, for example as a result of including the resiliently biased portion 720.

The unit electrical connector 800 may have any suitable shape. The electrical connector(s) 700 of the electrical raft 200 may be shaped/positioned accordingly. In the FIG. 3 example, the unit electrical connector 800 has a stepped shape. For example, this stepped shaped may take the form of two axially separated, concentric cylindrical portions of different diameters. In FIG. 3, the distal cylindrical portion has a smaller diameter than the proximal cylindrical portion (distal and proximal being in relation to the body of the electrical unit 300). The different portions of the unit electrical connector 800 are contact by different electrical connectors 700. The electrical raft 200 in the FIG. 3 arrangement has two sets of electrical connectors 700. Each set comprises two opposing electrical connectors 700, which have contact portions 710 that are provided with biasing forces in opposing directions by their respective biasing portions 720 when the unit electrical connector 800 is in place. A first set of electrical connectors 700 contact a distal end portion 810 of the unit electrical connector 800, and a second set of electrical connectors 700 contact a proximal end portion of the unit electrical connector 800. The connectors 700 in each set of electrical connectors may lie in the same plane as each other which may be parallel to the mounting plane 292. It is emphasized that the arrangement (for example number and positioning) of the electrical connectors 700 of the electrical raft 200, and of the unit electrical connector 800, in the FIG. 3 arrangement is merely by way of example only. It will be recognized that a great many other arrangements fall within the scope of the invention.

In FIG. 3, the electrical conductors 252 in the electrical raft 200 are themselves provided in a harness 250, which may be a flexible printed circuit board (or FPC) 250. Such an FPC is explained in greater detail elsewhere herein. However, the electrical conductors 252 embedded in the electrical raft 200 may be provided in any suitable way, for example as insulated or non-insulated wires or tracks laid directly into the rigid material 220. The electrical conductors 252 in FIG. 3 may be connected to the electrical connector 700 in any suitable manner, for example directly connected or via linking conductor(s) 214 such as those shown in FIG. 3.

Figure 4:
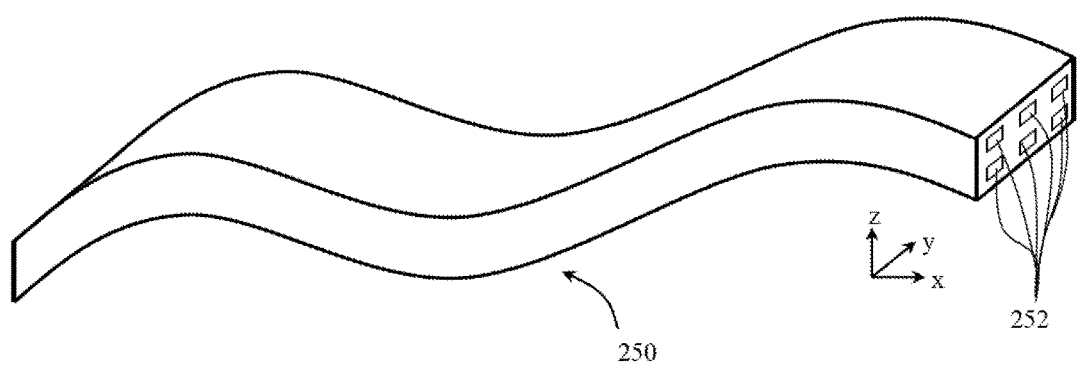
FIG. 4 shows a perspective view of a flexible printed circuit.
Figure 5:
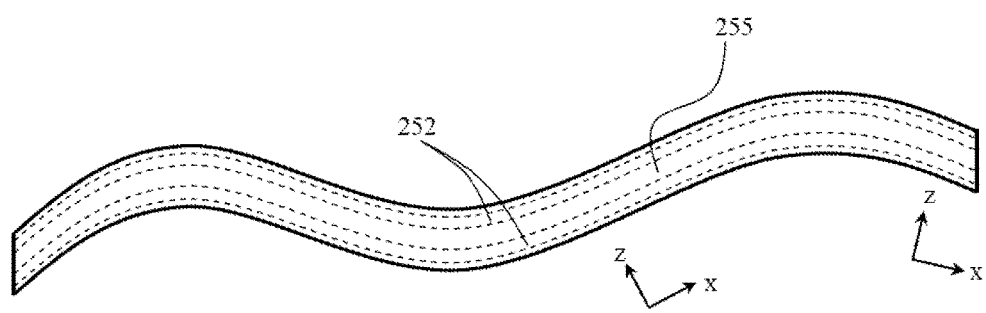
FIG. 5 shows a side view of the flexible printed circuit of FIG. 4.

An example of an FPC 250 in which the electrical conductors 252 may be provided is shown in greater detail in FIGS. 4 and 5. FIG. 4 shows a perspective view of the FPC 250, and FIG. 5 shows a side view.

Such an FPC 250 may comprise a flexible (for example elastically deformable) substrate 255 with conductive tracks 252 laid/formed therein. The FPC 250 may thus be deformable. The FPC 250 may be described as a thin, elongate member and/or as a sheet-like member. Such a thin, elongate member may have a major surface defined by a length and a width, and a thickness normal to the major surface. In the example shown in FIGS. 4 and 5, the FPC 250 may extend along a length in the x-direction, a width in the y-direction, and a thickness (or depth or height) in the z-direction. The x-direction may be defined as the axial direction of the FPC. Thus, the x-direction (and thus the z-direction) may change along the length of the FPC 250 as the FPC is deformed. This is illustrated in FIG. 5. The x-y surface(s) (ie the surfaces formed by the x and y directions) may be said to be the major surface(s) of the FPC 250. In the example shown in FIGS. 4 and 5, the FPC 250 is deformable at least in the z direction, i.e. in a direction perpendicular to the major surface. FPCs may be additionally of alternatively deformable about any other direction, and/or may be twisted about any one or more of the x, y, or z directions.

The flexible substrate 255 may be a dielectric. The substrate material may be, by way of example only, polyamide. As will be readily apparent, other suitable substrate material could alternatively be used.

The conductive tracks 252, which may be surrounded by the substrate 255, may be formed using any suitable conductive material, such as, by way of example only, copper, copper alloy, tin-plated copper (or tin-plated copper alloy), silver-plated copper (or silver-plated copper alloy), nickel-plated copper (or nickel-plated copper alloy) although other materials could alternatively be used. The conductive tracks 252 may be used to conduct/transfer electrical signals (including electrical power and electrical control signals) through the rigid raft assembly (or assemblies) 200, for example around a gas turbine engine 10 and/or to/from components of a gas turbine engine and/or an airframe attached to a gas turbine engine.

The size (for example the cross-sectional area) and/or the shape of the conductive tracks 252 may depend on the signal(s) to be transmitted through the particular conductive track 252. Thus, the shape and/or size of the individual conductive tracks 252 may or may not be uniform in a FPC 250.

The example shown in FIGS. 4 and 5 has 6 conductive tracks 252 running through the substrate 255. However, the number of conductive tracks 252 running through a substrate 255 could be fewer than 6, or greater than 6. Indeed the number of conductive tracks 252 could be far greater than 6, for example tens or hundreds of tracks, as required. As such, many electrical signals and/or power transmission lines may be incorporated into a single FPC 250.

A single FPC 250 may comprise one layer of tracks, or more than one layer of tracks, for example, 2, 3, 4, 5, 6, 7, 8, 9, 10 or more than 10 layers of tracks. An FPC may comprise significantly more than 10 layers of tracks, for example at least an order of magnitude more layers of tracks.

In this regard, a layer of tracks may be defined as being a series of tracks that extend in the same x-y surface. Thus, the example shown in FIGS. 4 and 5 comprises 2 layers of tracks, with each layer comprising 3 tracks 252.

An electrical raft 200 as described and claimed herein may be manufactured using any suitable method. For example, the rigid material 220 may initially be provided as layers of flexible material, such as (by way of example only) layers of fibre and resin compound. This flexible material may be placed into a mould, for example having a desired shape. Other components (such as fluid pipes 210 and/or the electrical conductors 252, which may be embedded in a FPC 250) may also be placed into the mould, for example between layers of the flexible material from which the rigid material 220 is ultimately formed. Parts of the mould may have any suitable form and/or construction, for example that could be readily removed when the electrical raft 200 is formed into the desired shape.

Figure 6:
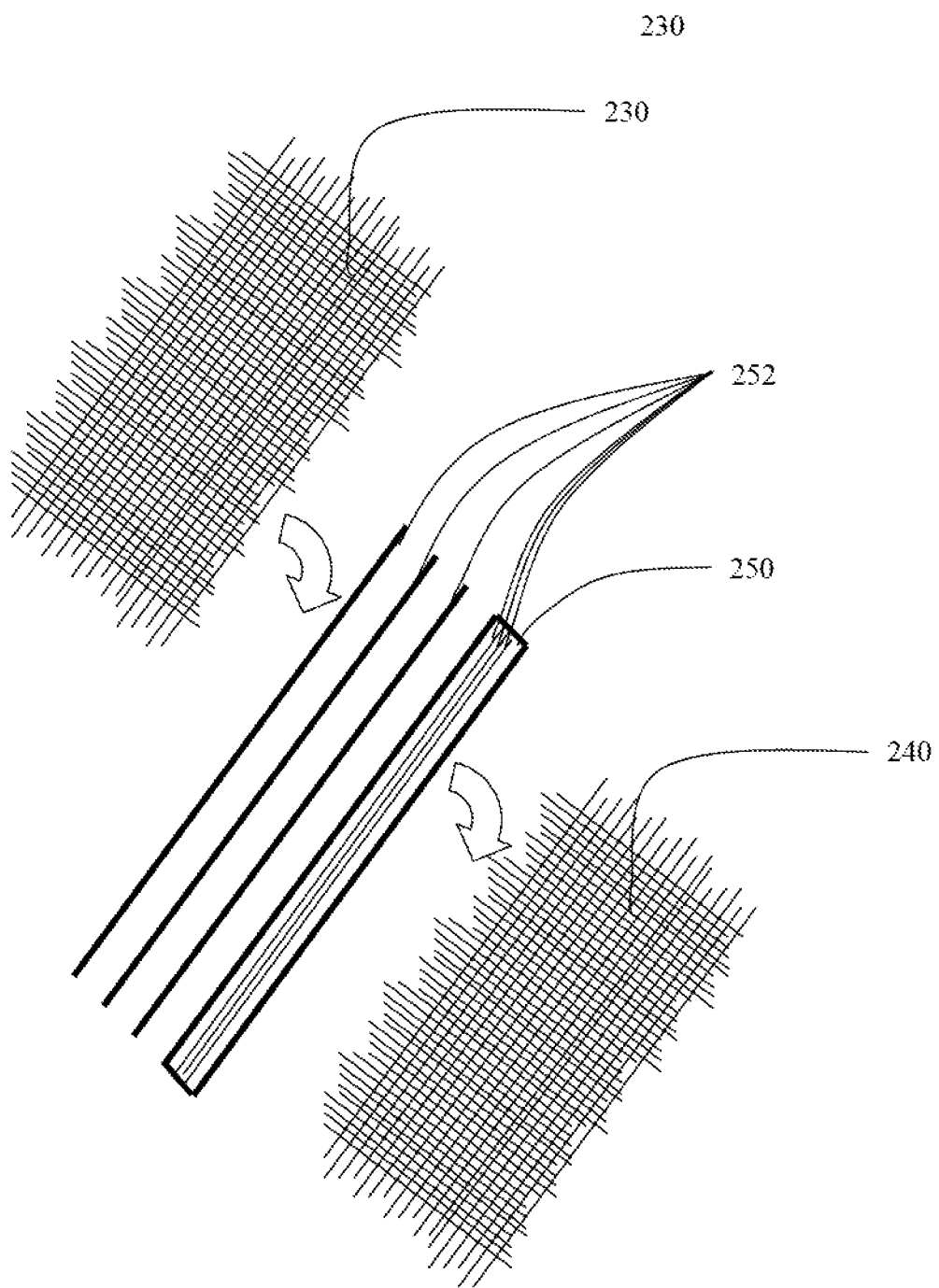
FIG. 6 shows a schematic of an electrical raft prior to assembly.

FIG. 6 shows components of an example of an electrical raft 200 prior to one method of construction. The electrical conductors 252 are provided between two layers of material 230, 240 that, after construction, form the rigid material 220. Some of the electrical conductors 252 are provided in an FPC 250. The material 230, 240 may be a fibre and resin compound, as described elsewhere herein. Such a fibre and resin compound may, after suitable treatment (for example heat treatment), produce the rigid composite material 220. In the example of FIG. 6, the fibre and resin compound is formed of a sheet of interwoven fibres, or strands. The strands in FIG. 6 extend in perpendicular directions, although the strands may extend in any one or more directions as required. The strands/fibres may be pre-impregnated (or "pre-pregged") with the resin.

Prior to any treatment, both the first and second layers 230, 240 and the electrical conductors 252 may be flexible, for example supple, pliable or malleable. As such, when the layers 230, 240 and the electrical conductors 252 are placed together, they may be moulded, or formed, into any desired shape. For example, the layers 230, 240 and the electrical conductors 252 may be placed into a mould (which may be of any suitable form, such as a glass or an aluminium mould) having the desired shape. The desired shape may be, for example, a shape that corresponds to (for example is offset from) a part of a gas turbine engine, such as, by way of example only, at least a part of a casing, such as an engine fan casing or engine core casing. This may enable the final raft, to adopt shapes that are curved in two-dimensions or three-dimensions.

Any suitable method could be used to produce the electrical raft 200. For example, the strands/fibres need not be pre-impregnated with the resin. Instead, the fibres/strands could be put into position (for example relative to electrical conductors 252/FPC 250) in a dry state, and then the resin could be fed (or pumped) into the mould. Such a process may be referred to as a resin transfer method. Indeed, in some constructions no fibre may be used at all in the rigid material 220.

After the treatment, the electrical raft 200 may be set in the desired shape. The electrical connectors 700 may be provided to the electrical raft 200 at any suitable time during manufacture, for example prior to any stiffening treatment of the rigid raft assembly 200, or after such treatment. For example, the or each connector 700 may be fixed (for example bonded) into an appropriate recess in the electrical raft. Such a recess may be formed using a correspondingly shaped mould, or may be formed (for example by machining or boring) after the rigid electrical raft is set. The embedded portion 730 of the each connector 700 may be electrically connected to one or more embedded conductors 252 at this stage.

Alternatively, the electrical connector(s) 700 may be embedded directly into the electrical raft 200 during the forming and setting of the electrical raft 200. As such, the rigid material 220 may set around the electrical connector(s) 700, thereby fixing them into position. In this case, the electrical conductors 252 may be in electrical contact with the electrical connector(s) 700 prior to the rigid material 220 being set around them.

Figure 7:
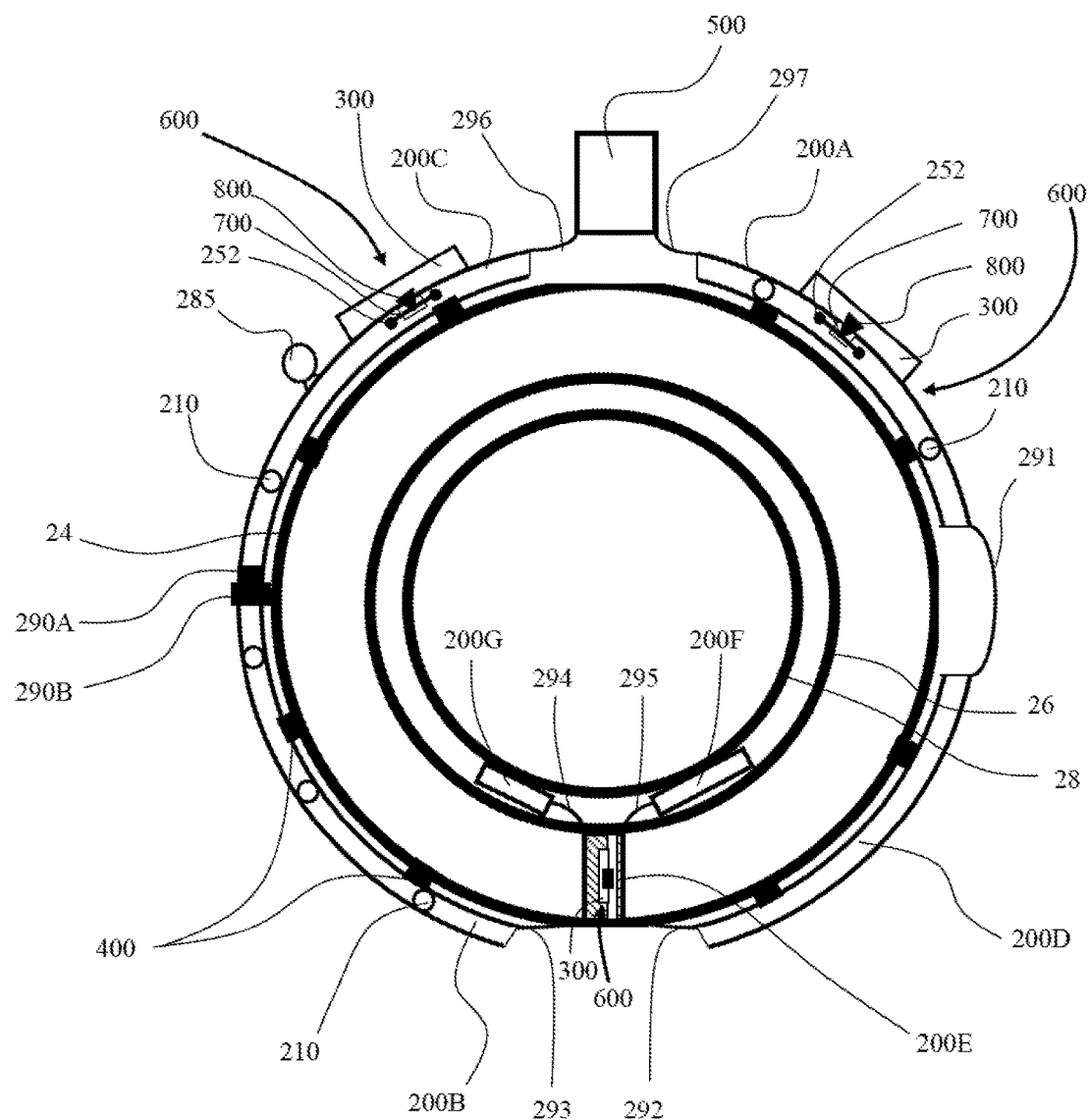
FIG. 7 shows a cross-section normal to the axial direction through a gas turbine engine according to an embodiment of the invention.

FIG. 7 is a schematic showing a cross-section perpendicular to the direction X-X of a gas turbine engine comprising electrical rafts 200A-200G. FIG. 7 shows seven electrical rafts 200A-200G (which may be referred to collectively as electrical rafts 200).

Three of the electrical rafts 200A, 200C, 200E have at least one electrical unit 300 mounted thereon to form an electrical raft assembly 600. These three electrical rafts 200A, 200C, 200E and/or the electrical raft assemblies 600 shown in FIG. 7 may thus be as described elsewhere herein, for example in relation to FIGS. 2-6. Thus, for example, the electrical raft assemblies 600 shown in FIG. 7 may comprise electrical connectors 700/800, and components thereof, described in greater detail elsewhere.

Although three electrical rafts 200A, 200C, 200D are shown as having an electrical unit 300 mounted thereon, it will be appreciated that any one or more of the electrical rafts 200A-200G may have an electrical unit 300 mounted thereon to form an electrical raft assembly 600. Each of the electrical rafts 200A-200G shown in FIG. 7 comprises one or more electrical conductors 252 as described elsewhere herein. However, any one or more of the electrical rafts 200A-200G may be replaced with a raft that does not comprise electrical conductors 252. Such a raft would not be an electrical raft 200, but may otherwise be as described elsewhere herein, for example it may be a rigid raft that may have components/systems (such as, by way of example only, fluid systems, such as pipes) mounted thereon and/or embedded therein. Thus, for example, a gas turbine engine in accordance with the present invention may have a combination of electrical rafts 200 and non-electrical rafts.

The arrangement of electrical rafts 200A-200G shown in FIG. 7 is by way of example only. Alternative arrangements, for example in terms of number, size, shape and/or positioning, of electrical rafts 200A-200G may be used. For example, there need not be 7 electrical rafts, the rafts may or may not be connected together, and the rafts could be provided to (for example mounted on) any one or more components of the gas turbine engine. Purely by way of example only, connection between electrical rafts 200A, 200B, 200C, 200D mounted on the fan casing 24 to the electrical rafts 200F, 200G mounted on the core casing 28 may be provided at least in part by means other than an additional electrical raft 200E, for example using wire conductors with insulating sleeves. By way of further example, one or more electrical rafts 200 may additionally or alternatively be provided to the nose cone, structural frames or elements within the engine (such as "A-frames"), the nacelle, the fan cowl doors, and/or any connector or mount between the gas turbine engine 10 and a connected structure (which may be at least a part of a structure in which the gas turbine engine 10 is installed), such as the pylon 500 between the gas turbine engine 10 and an airframe (not shown).

Any one or more of the electrical rafts 200A-200G may have a fluid passage 210 embedded therein. The fluid passage 210 may be part of a fluid system, such as a gas (for example pneumatic or cooling gas/air) and/or liquid (for example a fuel, hydraulic and/or lubricant liquid). In the FIG. 7 example, three of the electrical rafts 200A, 200B, 200C comprise a fluid passage 210 at least partially embedded therein. The electrical raft 200C also has a fluid passage (which may be for any fluid, such as those listed above in relation to embedded passage 210) mounted thereon. Such a mounted fluid passage 285 may be provided to any electrical raft, such as the electrical rafts 200A-200G shown in FIG. 7. The fluid passages 210, 285 shown in FIG. 7 may be oriented in an axial direction of the engine 10. However, fluid passages may be oriented in any direction, for example axial, radial, circumferential or a combination thereof.

In general, any electrical raft 200 may be provided with and/or may comprise (for example may have mounted on and/or have at least partially embedded therein) at least a part of any component and/or system of a gas turbine engine. Components/systems provided to different rafts 200 may be connected to each other, for example a component mounted on one raft 200 may be connected (for example directly electrically, mechanically and/or fluidly connected) to one or more components mounted on another raft 200.

The electrical rafts 200A-200G may be attached to the rest of the gas turbine engine 10 in any suitable manner. For example, as shown explicitly in relation to electrical raft 200B, mounts 400, which may be anti-vibration mounts, may be used. Using anti-vibration mounts 400 may, for example, allow all components of the electrical raft 200 and/or electrical raft assembly 600 to be isolated from vibrations. Thus, components of at least two gas turbine engine systems may be vibration isolated using a single set of anti-vibration mounts 400.

The electrical rafts 200A-200D are mounted to a fan case 24 in the example of FIG. 7. However, electrical rafts such as those described by way of example herein may be provided/mounted anywhere on the engine 10. For example, one or more electrical rafts 200F, 200G may be mounted between an engine core casing 28 and an engine core fairing 26. Also by way of example, one or more electrical raft 200E may be provided as at least a part of (for example in) a passage across the bypass duct 22, such as a bifurcation or splitter. In other respects, the electrical rafts mounted anywhere on the engine may be as described elsewhere herein, or otherwise in accordance with the invention.

Any of the electrical rafts 200A-200G (or non-electrical rafts in an arrangement where at least on the of rafts does not have electrical conductors 252) may have any combination of mechanical, electrical and/or fluid connections to one or more (for example 2, 3, 4, 5 or more than 5) other components/systems of the gas turbine engine 10 and/or the rest of the gas turbine engine 10 itself. Examples of such connections are shown in FIG. 7, and described below, but it will be appreciated that a gas turbine engine 10 including electrical rafts 200 may have connections that are different to those show in FIG. 7. For example, electrical rafts 200 (and/or non-electrical rafts) may be connected together (or to other components) using any combination of electrical, fluid and/or mechanical connectors. Thus, any of the electrical connections 290A/290B, 291-297 shown in FIG. 7 may be any combination of electrical, fluid and/or mechanical connection. Alternatively, electrical rafts (and/or non-electrical rafts) may have no connection to other rafts or components.

A connection 291 is shown between the electrical rafts 200A and 200D. The connection 291 may comprise an electrical connection. Such an electrical connection may be flexible and may, for example, take the form of a flexible printed circuit such as the flexible printed circuit 250 shown in FIGS. 4 and 5. Such a flexible electrical connection may be used to electrically connect any electrical raft 200 to any other component, such as another electrical raft 200. A connection 297 (which may be or comprise an electrical connection) is provided between the electrical raft 200A and a part of an airframe, or airframe installation 500, which may, for example, be a pylon. Similarly, a fluid and/or mechanical connection 296 may additionally or alternatively be provided between the airframe 500 and another electrical raft 200C. As shown in FIG. 7, other electrical and/or fluid connections 292, 293, 294, 295 may be provided between electrical rafts and other components, such as other electrical rafts.

A direct connection 290A, 290B is provided between the electrical rafts 200B and 200C in the FIG. 7 arrangement. Such a direct connection 290A, 290B may comprise a connector 290A provided on (for example embedded in) one electrical raft 200C connected to a complimentary connector 290B provided on (for example embedded in another electrical raft 200B. Such a direct connection 290A, 290B may, for example, provide fluid and/or electrical connection between the two electrical rafts 200B, 200C.

Where reference is made herein to a gas turbine engine, it will be appreciated that this term may include a gas turbine engine/gas turbine engine installation and optionally any peripheral components to which the gas turbine engine may be connected to or interact with and/or any connections/interfaces with surrounding components, which may include, for example, an airframe and/or components thereof. Such connections with an airframe, which are encompassed by the term 'gas turbine engine' as used herein, include, but are not limited to, pylons and mountings and their respective connections. The gas turbine engine itself may be any type of gas turbine engine, including, but not limited to, a turbofan (bypass) gas turbine engine, turbojet, turboprop, ramjet, scramjet or open rotor gas turbine engine, and for any application, for example aircraft, industrial, and marine application. Electrical rafts 200 such as any of those described and/or claimed herein may be used as part of any apparatus, such as any vehicle, including land, sea, air and space vehicles, such as motor vehicles (including cars and busses), trains, boats, submarines, aircraft (including aeroplanes and helicopters) and spacecraft (including satellites and launch vehicles).

It will be appreciated that many alternative configurations and/or arrangements of electrical rafts 200 and gas turbine engines 10 comprising electrical rafts 200 other than those described herein may fall within the scope of the invention. For example, alternative arrangements of electrical rafts 200 (for example in terms of the arrangement, including number/shape/positioning/constructions, of electrical connectors 700, the arrangement/shape/positioning/construction of the electrical rafts 200, the type and/or positioning of components (if any) mounted to/embedded in the electrical rafts 200, the rigid material 220 and the electrical conductors 252) may fall within the scope of the invention and may be readily apparent to the skilled person from the disclosure provided herein. Alternative arrangements of connections (for example mechanical, electrical and/or fluid) between the electrical (or non-electrical) rafts and between the electrical (or non-electrical) rafts and other components may fall within the scope of the invention and may be readily apparent to the skilled person from the disclosure provided herein. Furthermore, any feature described and/or claimed herein may be combined with any other compatible feature described in relation to the same or another embodiment.

We claim:

1. An electrical raft assembly for a gas turbine engine comprising:
    an electrical raft; and
    an electrical unit of a gas turbine engine,
    the electrical raft comprising:
        a rigid material having multiple electrical conductors in the form of a flexible printed circuit embedded therein such that the rigid material surrounds the electrical conductors and fixes the electrical conductors in position, the electrical conductors being a part of an electrical harness of the gas turbine engine;
        an electrical connector that electrically connects the electrical conductors in the electrical raft to the electrical unit;
        linking conductors being provided between the electrical conductors and the electrical connector; and
        a mounting surface on which the electrical unit is mounted, the electrical connector being provided in a recess extending from the mounting surface into the rigid material; wherein
    the electrical connector comprises:
        an embedded portion that is embedded in the rigid material;
        a contact portion, at least partially protruding from a surface of the rigid material, and being in electrical contact with a unit electrical connector on the electrical unit; and
        a resiliently biased portion configured to bias the contact portion away from the embedded portion when the contact portion is moved towards the embedded portion, the resiliently biased portion acting in a direction substantially parallel to the mounting surface, and wherein
        the electrical unit and the electrical raft are mechanically fixed together using mechanical fixings that are independent of the electrical connector.

2. The electrical raft assembly according to claim 1, comprising at least two substantially opposing electrical connectors forming at least one set of opposing electrical connectors.

3. The electrical raft assembly according to claim 1, wherein at least a part of the resiliently biased portion is contained within the rigid material.

4. The electrical raft assembly according to claim 1, wherein the contact portion of the electrical connector extends from the recess in a direction that is substantially parallel to the mounting surface.

5. The electrical raft assembly according to claim 1, further comprising mounting portions for mechanically mounting the electrical unit to the electrical raft, the mounting portions being separate from the electrical connector.

6. The electrical raft assembly according to claim 1, wherein the unit electrical connector and the electrical connector of the electrical raft point in substantially perpendicular directions.

7. An electrical raft assembly according to claim 1, wherein:
    the contact portion of the electrical connector of the electrical raft has a tapered cross-section such that the contact portion is pushed against the resiliently biased portion by the unit electrical connector as the unit electrical connector is moved into position during assembly.

8. A gas turbine engine comprising the electrical raft assembly according to claim 1.

9. The gas turbine engine according to claim 8, wherein the electrical raft assembly is a first engine installation component, and the gas turbine engine further comprises:
   a second engine installation component having electrical conductors; and
   at least one flexible cable connected between the electrical raft assembly and the second engine installation component so as to electrically connect electrical conductors of the electrical raft assembly with electrical conductors of the second engine installation component.

10. A method of assembling an electrical raft assembly according to claim 1, the method comprising:
   moving the electrical raft and the electrical unit together so that the unit electrical connector urges the contact portion of the electrical connector of the electrical raft against the resiliently biased portion, such that the resiliently biased portion provides a biasing force on the contact portion towards the unit electrical connector.

* * * * *